United States Patent
Ahn et al.

(10) Patent No.: US 7,525,125 B2
(45) Date of Patent: Apr. 28, 2009

(54) THIN FILM TRANSISTOR AND ORGANIC ELECTRO-LUMINESCENCE DISPLAY DEVICE USING THE SAME

(75) Inventors: Tae Joon Ahn, Seoul (KR); Hong Koo Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 150 days.

(21) Appl. No.: 11/643,968

(22) Filed: Dec. 22, 2006

(65) Prior Publication Data
US 2007/0290206 A1 Dec. 20, 2007

(30) Foreign Application Priority Data
Jun. 14, 2006 (KR) ................. 10-2006-0053601

(51) Int. Cl.
*H01L 29/786* (2006.01)
(52) U.S. Cl. .................... 257/89; 257/83; 257/59; 257/E29.151
(58) Field of Classification Search ............ 257/89, 257/83, 59, E29.151
See application file for complete search history.

(56) References Cited

U.S. PATENT DOCUMENTS
6,510,193 B1 * 1/2003 Kochi et al. ............... 377/60

FOREIGN PATENT DOCUMENTS
KR 10-2005-0039168 4/2005

* cited by examiner

*Primary Examiner*—Marcos D. Pizarro
*Assistant Examiner*—Tifney L Skyles
(74) *Attorney, Agent, or Firm*—Holland & Knight LLP

(57) ABSTRACT

A thin film transistor includes a semiconductor pattern on a substrate, a gate insulating film to cover the semiconductor pattern, a gate electrode partially overlapping the semiconductor pattern with the gate insulating film there between, a hole in the gate electrode to expose the gate insulating film, an interlayer insulating film to cover the gate electrode, and a source electrode and a drain electrode contacting the semiconductor pattern through the interlayer insulating layer and the gate insulating layer, wherein the semiconductor pattern includes at least two channels between the source electrode and the drain electrode, the at least two channels having a region with a varying width.

6 Claims, 14 Drawing Sheets

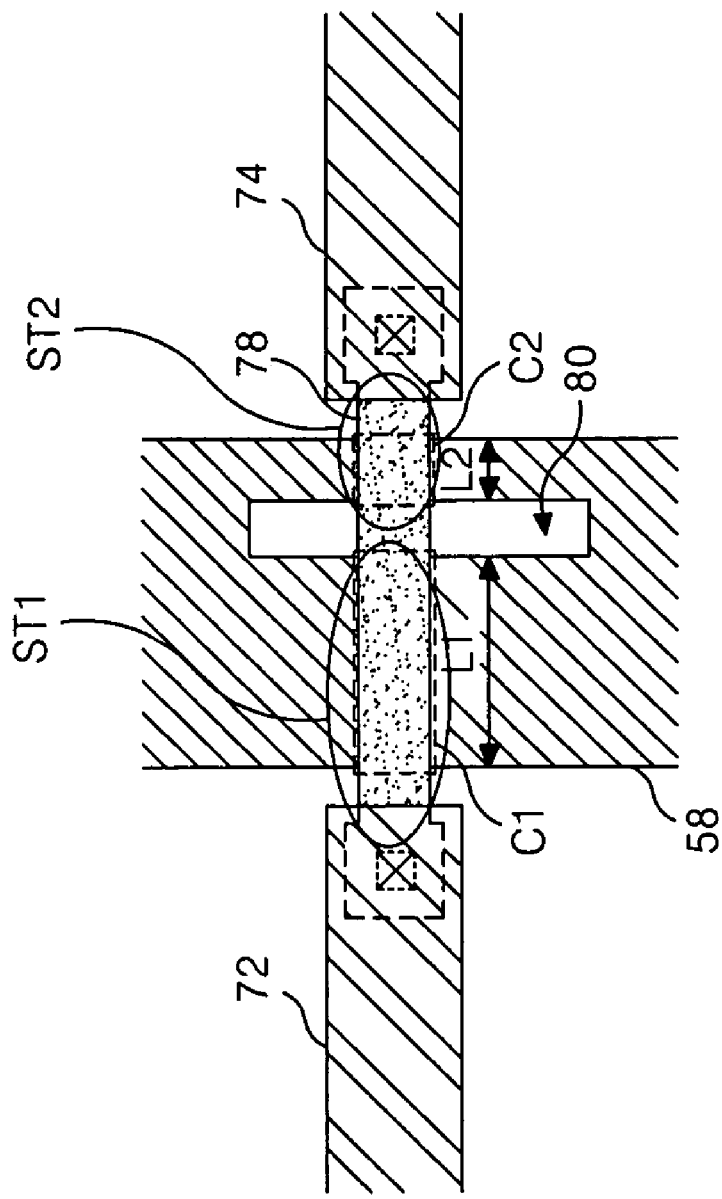

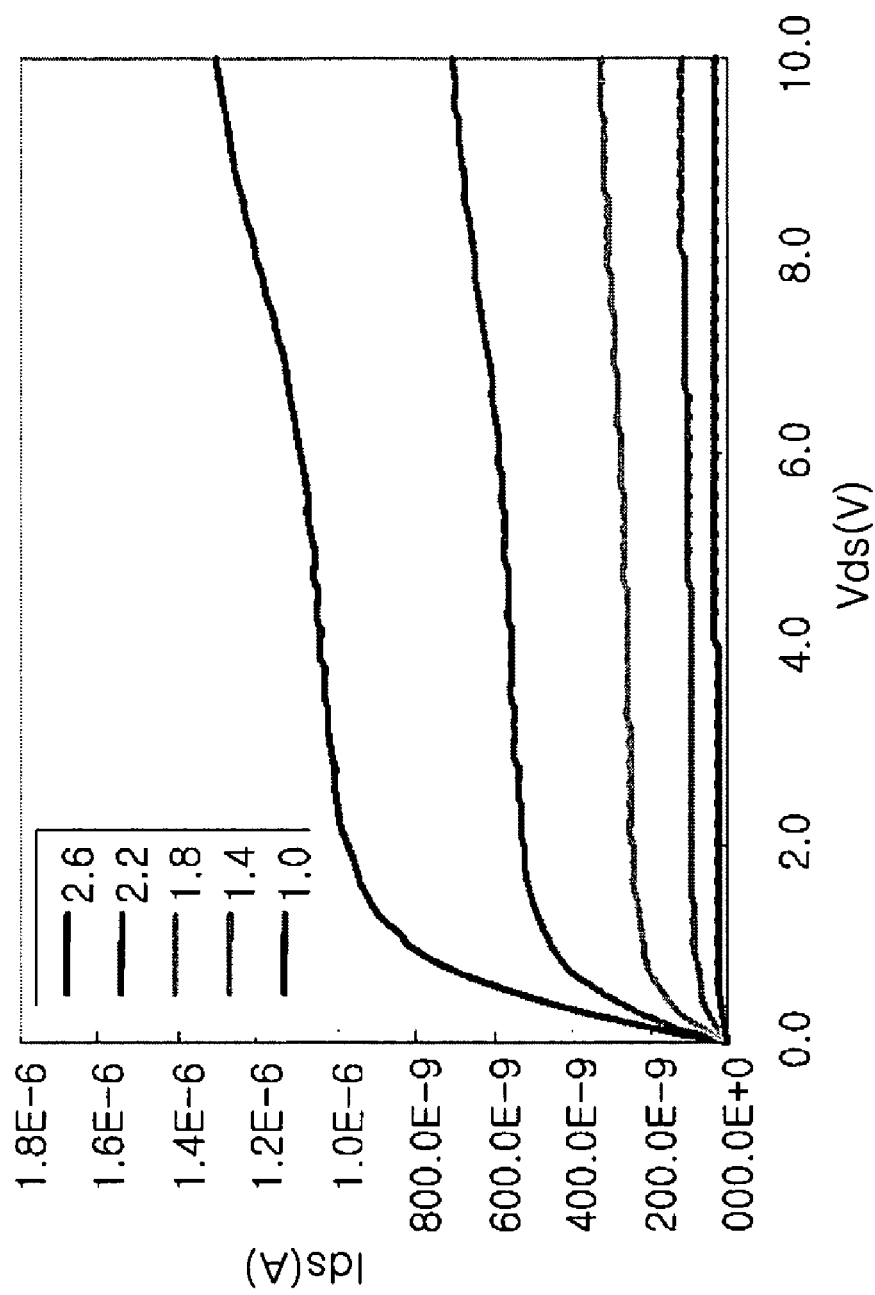

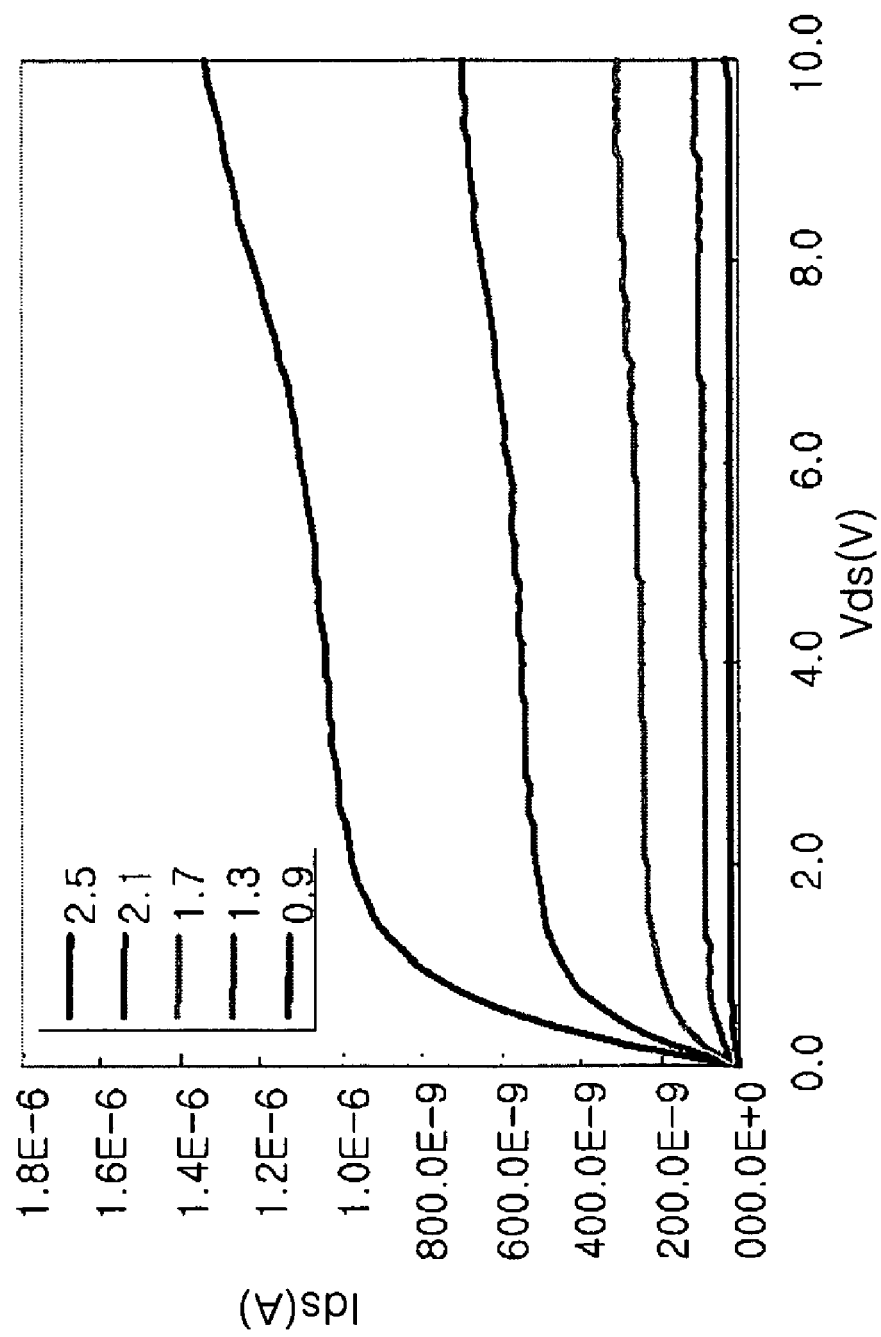

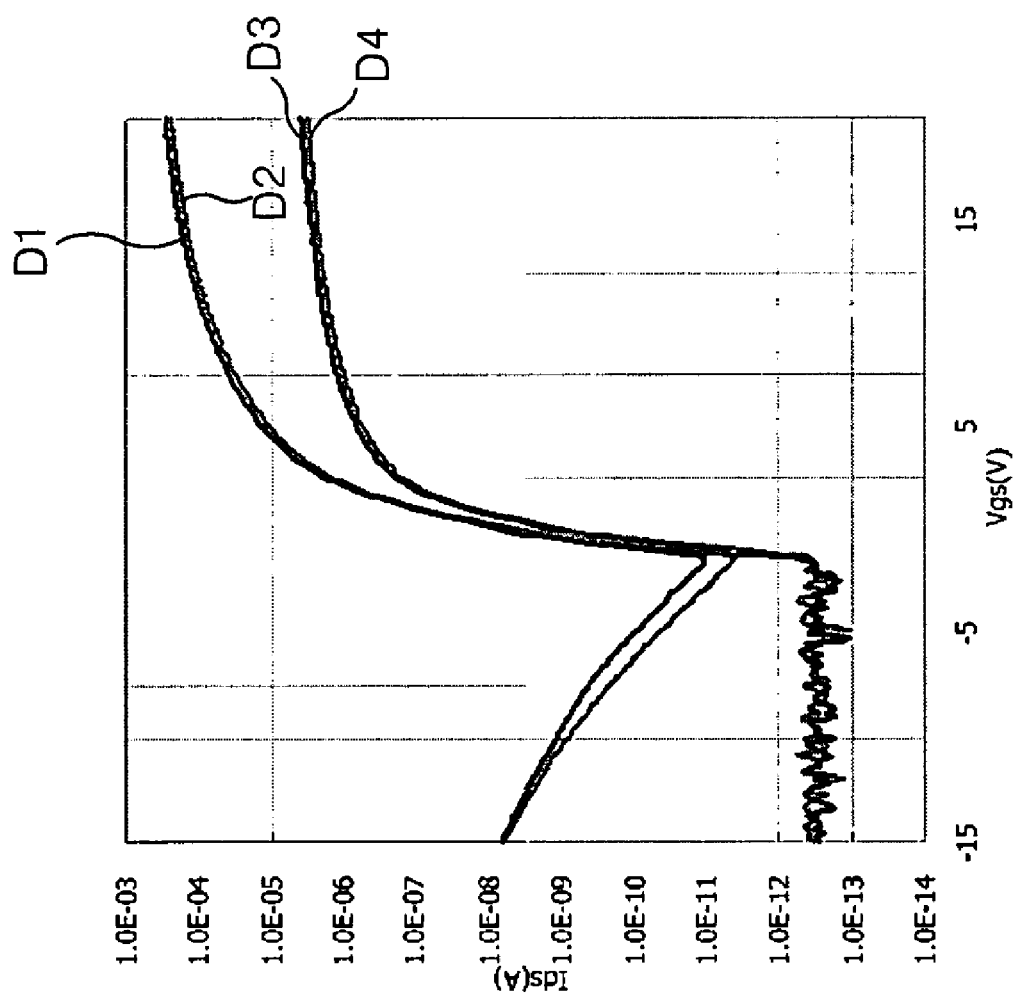

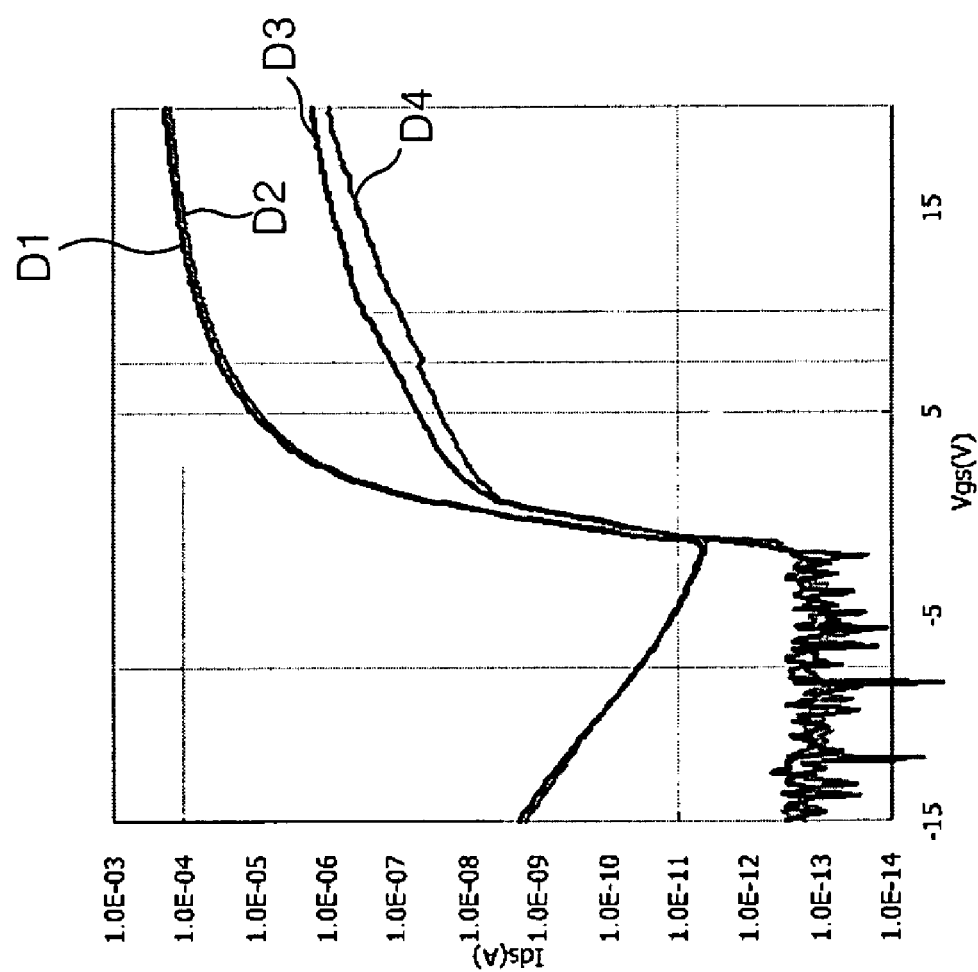

THIN FILM TRANSISTOR AND ORGANIC ELECTRO-LUMINESCENCE DISPLAY DEVICE USING THE SAME

The invention claims the benefit of Korean Patent Application No. P2006-0053601 filed in Korea on Jun. 14, 2006, which is hereby incorporated by reference in its entirety.

BACKGROUND OF THE INVENTION

1. Field of the Invention

The present invention relates to an organic electro-luminescence display device, and more particularly, to a thin film transistor and an electro-luminescence display device using the same that are adaptive for improving a credibility of an organic light-emitting cell drive.

2. Discussion of the Related Art

Recently, flat display panels with reduced weight and size have been developed to eliminate disadvantages of a cathode ray tube display device. Such flat panel display devices include a liquid crystal display (hereinafter, referred to as "LCD") device, a field emission display (hereinafter, referred to as "FED") device, a plasma display panel (hereinafter, referred to as "PDP") device, and an electro-luminescence (hereinafter, referred to as "EL") display device. In addition, there are active studies for making a flat panel display device with high display quality and a large-dimension screen.

In general, a PDP has been highlighted among flat panel display devices as advantageous to have light weight, a small size and a large dimension screen because its structure and manufacturing process are simple. However, a PDP has a low light-emission efficiency and requires large power consumption. Likewise, an active matrix LCD device employing a thin film transistor (hereinafter, referred to as "TFT") as a switching device has experienced drawbacks in that it is difficult to make a large dimension screen because a semiconductor process is used. In addition, an active matrix LCD device requires a large power consumption due to a backlight unit and has a large light loss and a narrow viewing angle due to optical devices, such as a polarizing filter, a prism sheet and a diffuser.

Meanwhile, an EL display device is largely classified into an inorganic EL display device and an organic light-emitting diode display device depending upon a material of a light-emitting layer. An EL display device also is advantageous in that it is self-luminous. When compared with the above-mentioned display devices, the EL device generally has a faster response speed, a higher light-emission efficiency, greater brightness and a wider viewing angle.

The inorganic EL display device has a larger power consumption than the organic EL display device, and cannot obtain a higher brightness than the organic EL display device and cannot emit various colors such as red (R), green (G) and blue (B) colors. On the other hand, the organic EL display device is driven with a low direct current voltage of tens of volts, and has a fast response speed. Also, the organic EL display device can obtain a high brightness, and can emit various colors of red (R), green (G) and blue (B). Thus, the organic EL display device is suitable for a post-generation flat panel display device.

In general, a system of driving of an organic EL display device can be classified into a passive matrix type and an active matrix type. The passive matrix organic EL display device has a simple structure and a simple fabricating method, but has large power consumption. In addition, it is difficult to make a large dimension passive matrix organic EL display device. Further, the passive matrix organic EL display device has a drawback in that as the number of wirings increases, an aperture ratio becomes lower. On the other hand, an active matrix organic EL display device has an advantage in that it is capable of providing high light-emission efficiency and a high picture quality.

FIG. 1 is a circuit diagram illustrating a pixel of an active matrix organic electro-luminescence display device according to the related art. In FIG. 1, an active matrix organic EL display device has a structure where pixels P are arranged in a matrix type and at an area defined by an intersection between a gate line GL and a data line DL. Each of the pixels P receives a data signal from the data line DL when a gate pulse is applied to the gate line GL, thereby generating a light corresponding to the data signal.

In addition, each of the pixels P includes an EL cell EL having a cathode connected to a ground voltage source GND, and a cell driver 60. The cell driver 60 is connected to the gate line GL, the data line DL and a supply voltage source VDD and is connected to an anode of the EL cell EL to drive the EL cell EL. The cell driver 60 includes a switching TFT T1, a driving TFT T2 and a capacitor C. The switching transistor T1 is turned on when a scanning pulse is applied to the gate line GL, thereby applying the data signal to a first node N1. The data signal applied to the first node N1 is charged into the capacitor C and is supplied to a gate terminal of the driving TFT T2. The driving TFT T2 controls a current amount I fed from the supply voltage source VDD into the EL cell EL in response to the data signal applied to the gate terminal thereof. The data signal is discharged from the capacitor C even though the switching TFT T1 is turned off, so that the driving TFT T2 applies a current I from the supply voltage source VDD until a data signal at the next frame is supplied, thereby keeping a light-emission of the EL cell EL.

The driving TFT of the organic EL display device having a structure that the pixels in FIG. 1 are arranged in a matrix type employs poly-Si or a-Si semiconductor. In general, the driving TFT T2 using a-Si semiconductor in comparison to the driving TFT T2 using poly-Si semiconductor has an advantages of a simple fabricating process, but has drawbacks of a low electron mobility, a low stability and a low credibility. Accordingly, the driving TFT T2 using poly-Si semiconductor is a popular used, but the driving TFT T2 using poly-Si semiconductor has a problem of a kink effect that is not generated in the driving TFT T2 using a-Si semiconductor.

FIGS. 2A and 2B are graphs illustrating driving characteristics of a driving thin film transistor employing amorphous-Si semiconductor and of a driving thin film transistor employing poly-Si semiconductor according to the related art, respectively. First, a relationship among Vds, Ids and Vgs of the driving TFT T2 using a-Si semiconductor is as shown in FIG. 2A. Vds represents a voltage between a source electrode of the driving TFT T2 and a drain electrode of the driving TFT T2, Ids represents a current or an output current of the driving TFT T2 flowing at the source electrode of the driving TFT T2 and the drain electrode of the driving TFT T2, and Vgs represents a voltage between a gate electrode of the driving TFT T2 and the source electrode of the driving TFT T2.

As shown in FIG. 2A, in the driving TFT T2 using a-Si semiconductor, Ids is proportional to Vds in an interval (hereinafter, referred to as "first interval") having a low Vds (where Vgs is constant), and Ids has a constant value irregardless of Vds in an interval (hereinafter, referred to as "second interval") that Vds has a bigger value than the first interval. In particular, Ids is proportionally increased in a value of Vgs in the first interval. Accordingly, a driving characteristics of the driving TFT is stable and a credibility is a pretty good in view of a stability of Ids in the driving TFT T2 using a-Si semiconductor.

As shown in FIG. 2B, in the driving TFT T2 using poly-Si semiconductor, Ids is proportional to Vds in the first interval, and in the second interval, Ids increases at a bigger value than the first interval. In addition, if Vds is larger than a designated value, then Ids increase non-uniformly in an area A, which is referred to a kink effect. The kink effect reduces a driving current of the organic EL cell for emitting the organic EL cell, to thereby cause a reduction in a life span of the organic electro-luminescence display device. To reduce the kink effect, a poly-Si TFT having a dual gate structure has been suggested.

FIG. 3 is a planar schematic diagram illustrating a driving thin film transistor employing poly-Si semiconductor having a dual-gate structure according to the related art, and FIG. 4 is a planar schematic diagram illustrating another driving thin film transistor employing poly-Si semiconductor having a dual-gate structure according to the related art. In FIG. 3, a dual gate TFT includes a penetration hole 80 passing through a center of a gate electrode 58. Thus, a poly-Si semiconductor pattern 78 and the gate electrode 58 cross each other at two areas. The penetration hole 80 passing through the center of the gate electrode 58 is adjoined to a drain electrode 74, to thereby implement first and second sub TFTs ST1 and ST2 having different-sized channel C1 and C2 between a source electrode 72 and the drain electrode 74. In particular, a channel length L1 of the first sub TFT ST1 adjacent to the source electrode 72 is formed to be larger than a channel length L2 of the second sub TFT ST2 adjacent to the drain electrode 74. Such a structure has a kink effect reduction phenomenon, but since the channel length is adjusted, the driving TFT becomes oversized. Thus, the structure is inappropriate to a high-resolution display model.

In FIG. 4, an alternative design of a width W of a channel has been suggested in order to solve a problem by the above-mentioned channel length. In particular, a second channel width W2 of the second sub TFT ST2 adjacent to the drain electrode 74 is formed to have a longer length than a first channel width W1 of the first sub TFT ST1 adjacent to the source electrode 72. Such a structure has a kink effect reduction effect and a size reduction effect. However, an electric field is concentrated at a cusp B of the second channel area, to thereby generate a deterioration at the cusp B. Thus, the structures according to the related have a problem in that a stability of the driving TFT is reduced and a life span of the driving TFT is shortened.

SUMMARY OF THE INVENTION

Accordingly, embodiments of the invention is directed to a thin film transistor and an organic electro-luminescence display device employing the same that substantially obviate one or more of the problems due to limitations and disadvantages of the related art.

An object of embodiments of the invention is to provide a thin film transistor and an organic electro-luminescence display device employing the same that have an improved reliability of an organic light-emitting cell drive for the electro-luminescence display device.

An object of embodiments of the invention is to provide a thin film transistor and an organic electro-luminescence display device employing the same that have a long life span.

Another object of embodiments of the invention is to provide of a thin film transistor and an organic electro-luminescence display device employing the same that prevent the kink effect and avoid a deterioration by an electric field, while being applicable for a large a high-level resolution model.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a thin film transistor includes a semiconductor pattern on a substrate, a gate insulating film to cover the semiconductor pattern, a gate electrode partially overlapping the semiconductor pattern with the gate insulating film therebetween, a hole in the gate electrode to expose the gate insulating film, an interlayer insulating film to cover the gate electrode, and a source electrode and a drain electrode contacting the semiconductor pattern through the interlayer insulating layer and the gate insulating layer, wherein the semiconductor pattern includes at least two channels between the source electrode and the drain electrode, the at least two channels having a region with a varying width.

In another aspect, an organic electro-luminescence display device includes an organic electro-luminescence array portion on a substrate and having organic light-emitting cells arranged in a matrix type, and a thin film transistor array portion between the substrate and the organic electro-luminescence array portion, and including a thin film transistor for driving the organic light-emitting cells, wherein the thin film transistor includes: a gate insulating film to cover a semiconductor pattern, a gate electrode partially overlapping the semiconductor pattern with the gate insulating film therebetween, a hole in the gate electrode to expose the gate insulating film, an interlayer insulating film to cover the gate electrode, and a source electrode and a drain electrode contacting the semiconductor pattern through the interlayer insulating layer and the gate insulating layer, wherein the semiconductor pattern includes at least two channels between the source electrode and the drain electrode, the at least two channels having a region with a varying width.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIG. 3 is a planar schematic diagram illustrating a driving thin film transistor employing poly-Si semiconductor having a dual-gate structure according to the related art;

FIGS. 10A and 10B are diagrams illustrating an output current of a driving thin film transistor having the dual-gate structure shown in FIG. 4 and an output current of a driving thin film transistor having the dual-gate structure shown in FIGS. 7 and 8, respectively; and FIGS. 11A and 11B are diagrams illustrating an output current of a driving thin film transistor having the dual-gate structure shown in FIG. 4 and an output current of a driving thin film transistor having the dual-gate structure shown in FIGS. 7 and 8 before and after a stress in a specific condition.

DETAILED DESCRIPTION OF THE PREFERRED EMBODIMENTS

Reference will now be made in detail to the preferred embodiments of the invention, examples of which are illustrated in the accompanying drawings.

Figure 5:
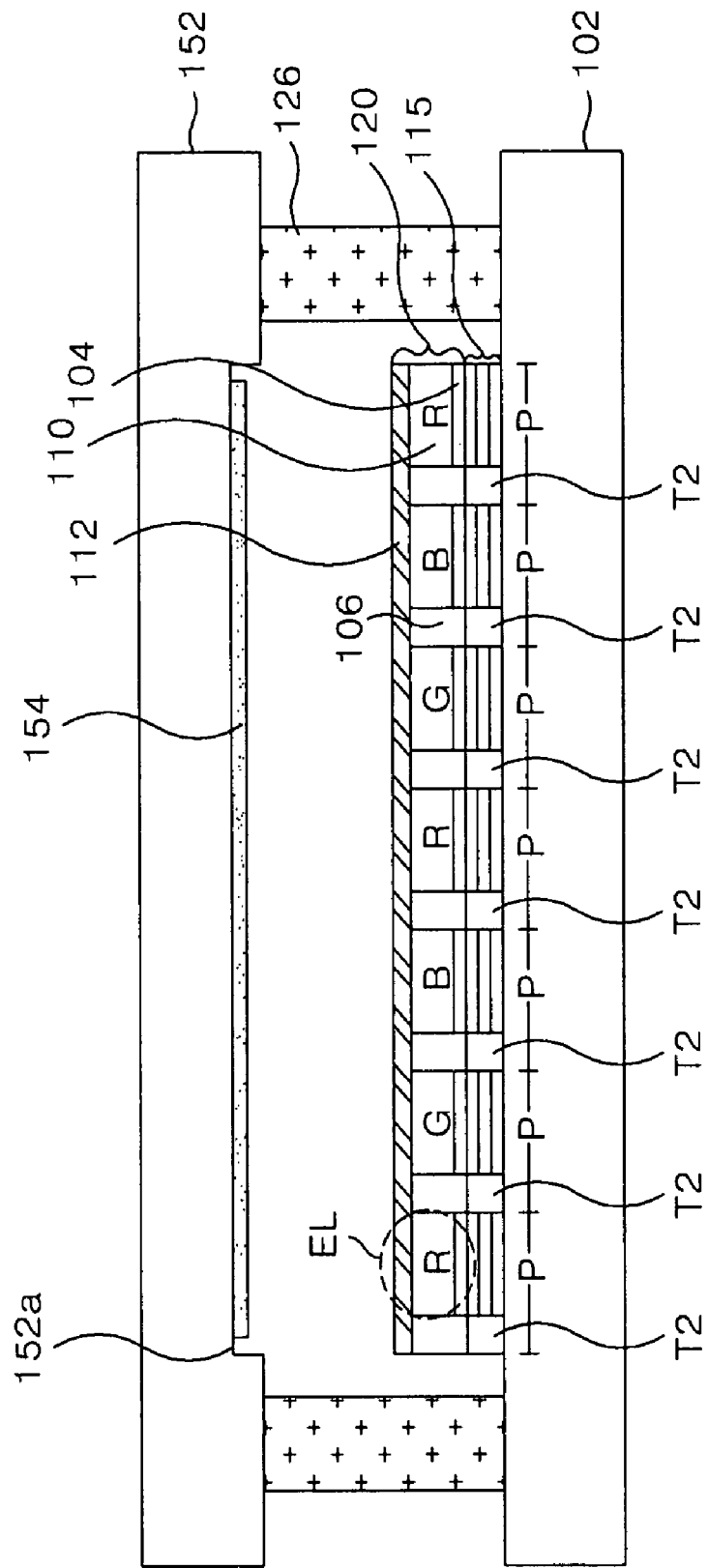
FIG. 5 is a sectional schematic diagram illustrating an active-matrix organic electro-luminescence display device.

FIG. 5 is a sectional schematic diagram illustrating an active-matrix organic electro-luminescence display device. Referring to FIG. 5, an organic EL display device includes a thin film transistor array portion 115 formed on a transparent substrate 102, an organic EL array portion 120 positioned on the thin film transistor array portion 115, and a glass cap 152 for isolating the organic EL array portion 120 from an external environment. The thin film transistor array portion 115 includes driving elements for driving an organic EL cell, such as a gate line, a data line and a cell driver 60. In the organic EL array portion 120, the organic EL cells connected to the driving thin film transistor T2 of the thin film transistor array portion 115 are arranged in a matrix type.

The organic EL cell includes a first electrode 104 (or "an anode electrode") connected to the driving thin film transistor T2, a bank 106 (or "an insulating film") for separating each pixel, an organic light-emitting layer 110, and a second electrode 112 (or "a cathode electrode"). The organic light-emitting layer 10 includes an electron injection layer, an electron carrier layer, a light-emitting layer, a hole carrier layer, and a hole injection layer, and the light-emitting layer implements one color of a red R, a green G and a blue B.

The organic EL cells of the organic EL array portion 120 can be deteriorated by water and oxygen. Thus, an encapsulation process is employed to solve this water/oxygen deterioration problem to attach the substrate 102 and the glass cap 152 by a sealant 126. The glass cap 152 emits heat generated upon light-emitting and protects the organic EL array 120 from an external force, water and oxygen.

In the glass cap 152, a groove 152a is prepared at a surface facing the organic EL array portion 120, and a moisture absorbent 154 is positioned within the groove 152a. The moisture absorbent 154 responds to an inorganic oxide, for example, water from a material, such as, CaO forming hydroxyl OH and BaO, and is formed in a tape type to attach within the groove 152a at the center of the glass cap 152. The moisture absorbent 154 absorbs water and oxygen in the organic EL array portion 120 packaged by the glass cap 152.

Figure 1:
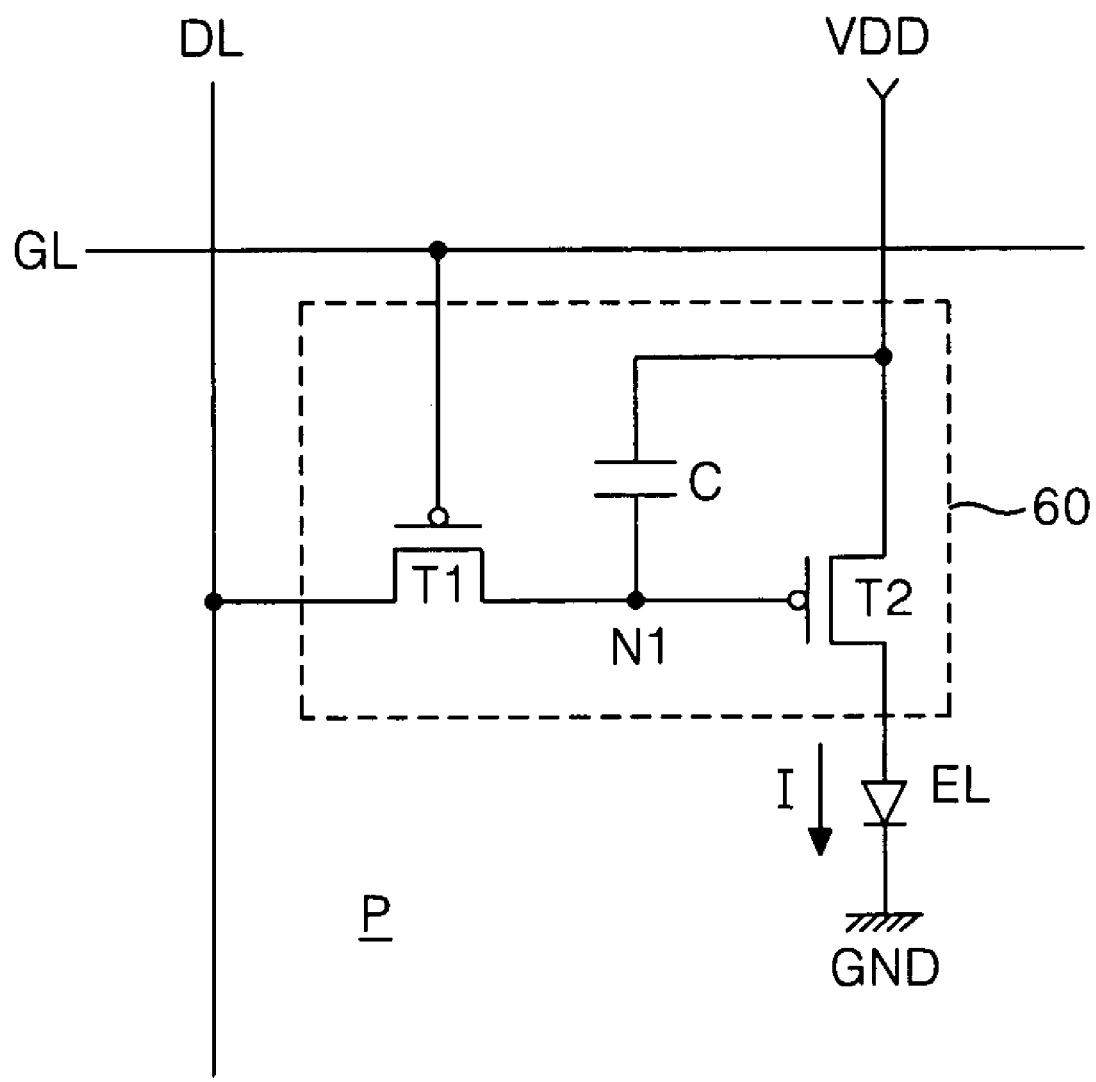
FIG. 1 is a circuit diagram illustrating a pixel of an active matrix organic electro-luminescence display device according to the related art.
Figure 2A:
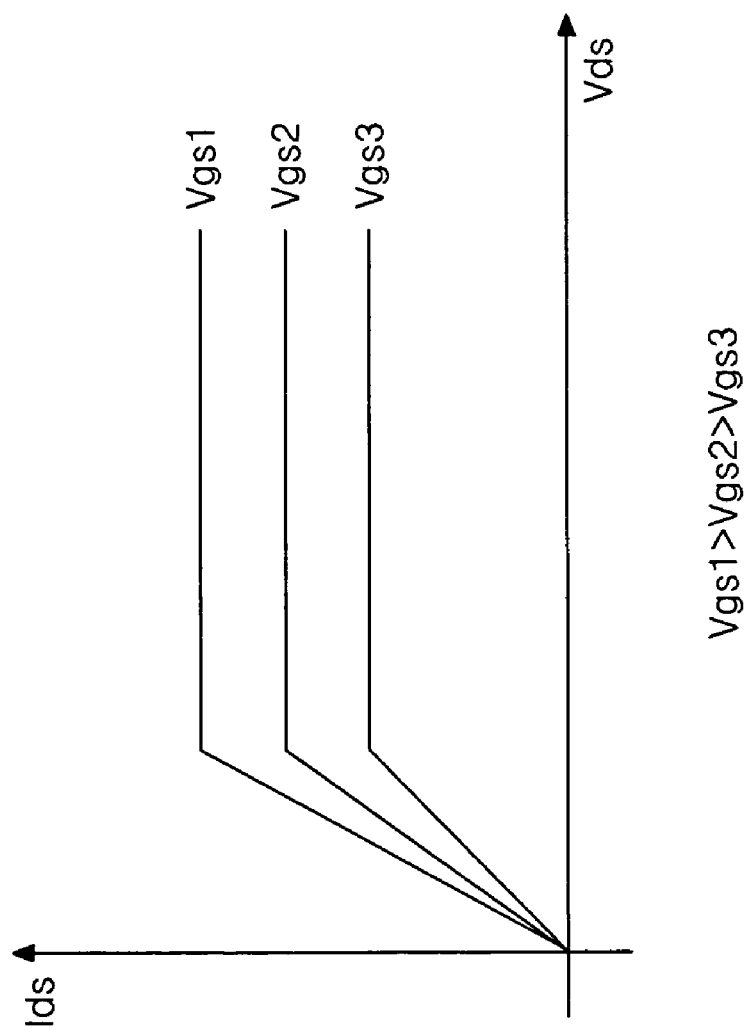
FIGS. 2A and 2B are graphs illustrating driving characteristics of a driving thin film transistor employing amorphous-Si semiconductor and of a driving thin film transistor employing poly-Si semiconductor according to the related art, respectively.
Figure 2B:
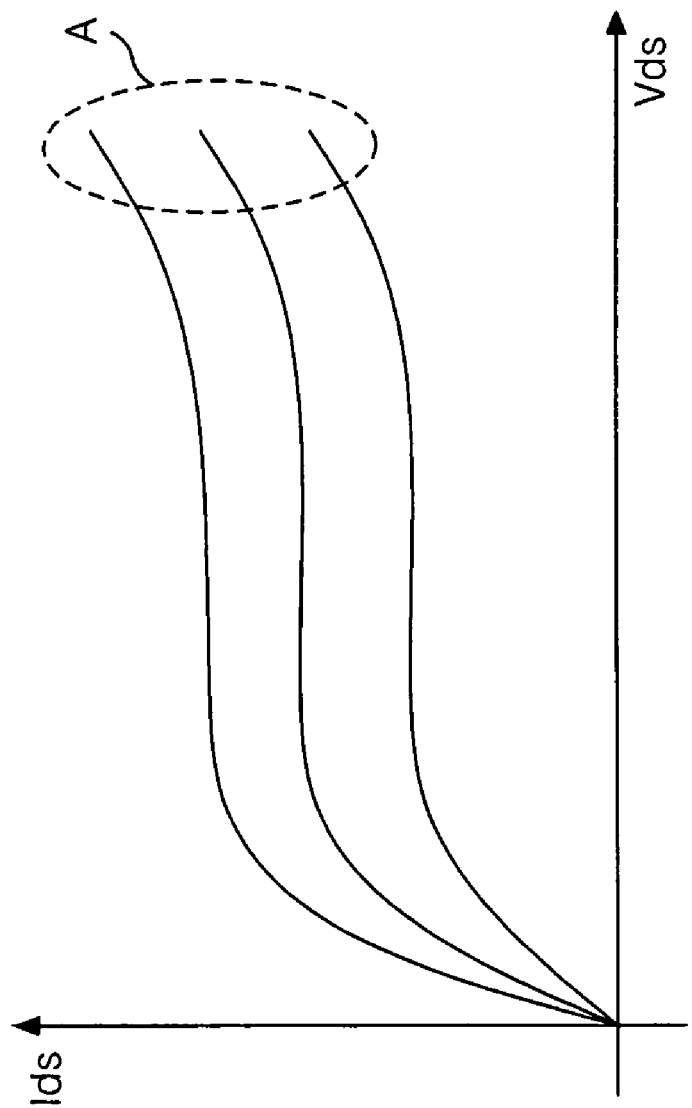
Figure 6:
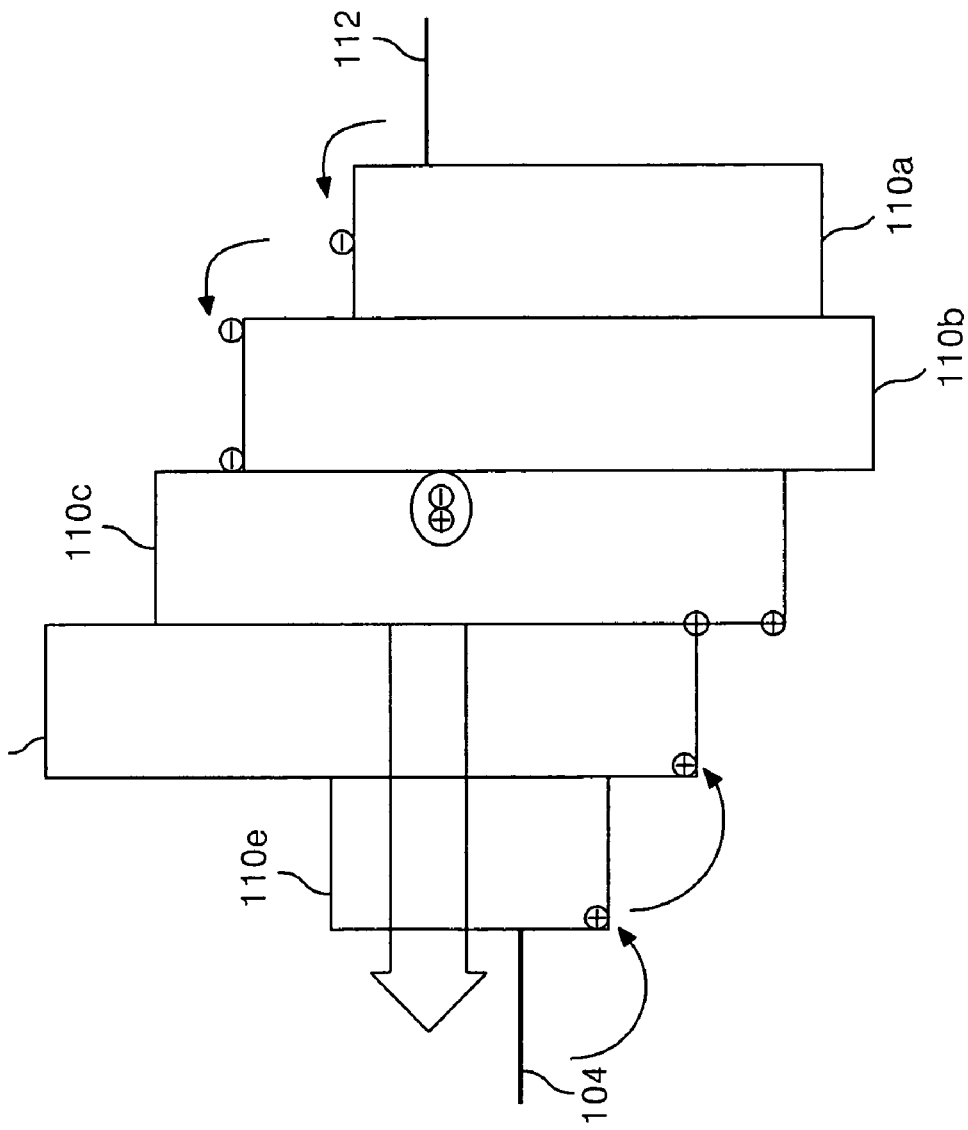
FIG. 6 is a diagram for explaining a light-emitting principle of the organic light-emitting cell shown in FIG. 5.

FIG. 6 is a diagram for explaining a light-emitting principle of the organic light-emitting cell shown in FIG. 5. Referring to FIG. 6, in the organic EL display device having a structure shown in FIG. 1 and FIG. 5, if a voltage is applied between the first electrode 104 and the second electrode 112 of the organic EL cell, then electrons generated from the second electrode 112 are moved, via the electron injection layer 110a and the electron carrier layer 110b, into the light-emitting layer 110c. Further, holes generated from the first electrode 104 are moved, via the hole injection layer 110e and the hole carrier layer 110d, into the light-emitting layer 110c. Thus, electrons and holes fed from the electron carrier layer 110b and the hole carrier layer 110d are collided and re-combined with each other, to thereby generate light in the light-emitting layer 110c. Such light is emitted, via the first electrode 104, into the exterior, to thereby display a picture.

Figure 7:
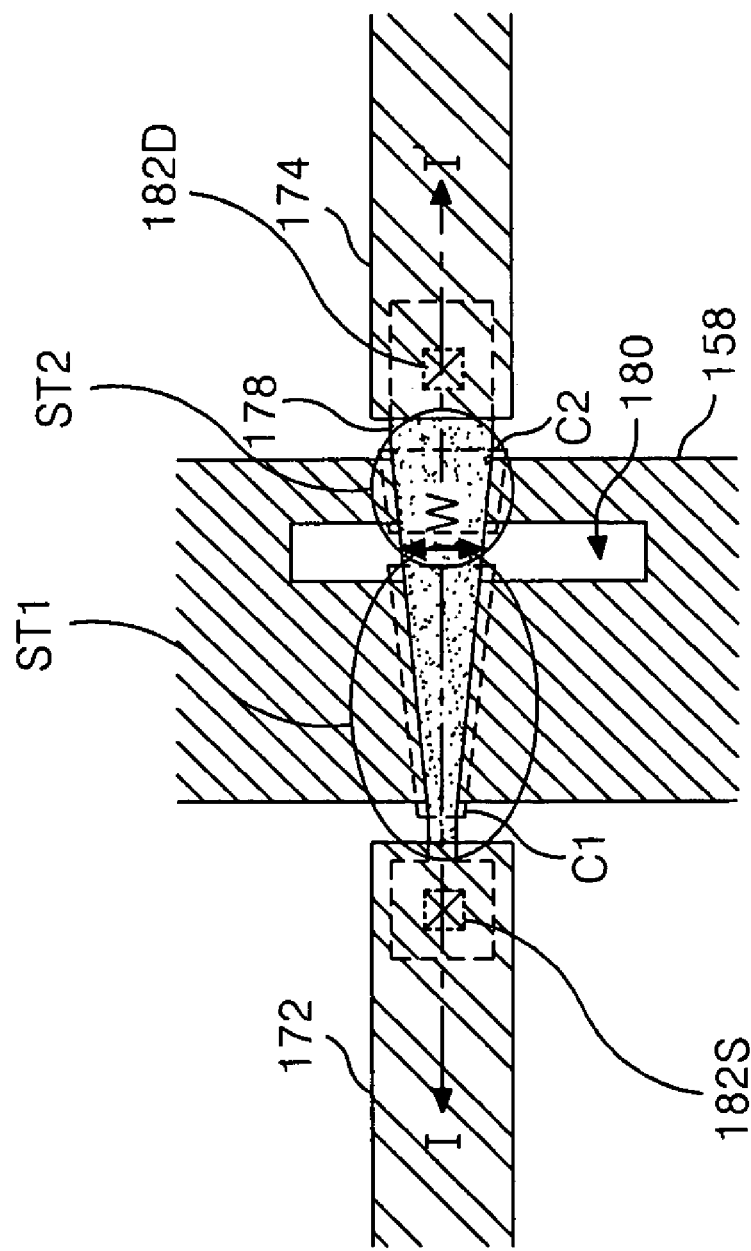
FIG. 7 is a planar view showing a thin film transistor according to an embodiment of the present invention.
Figure 8:
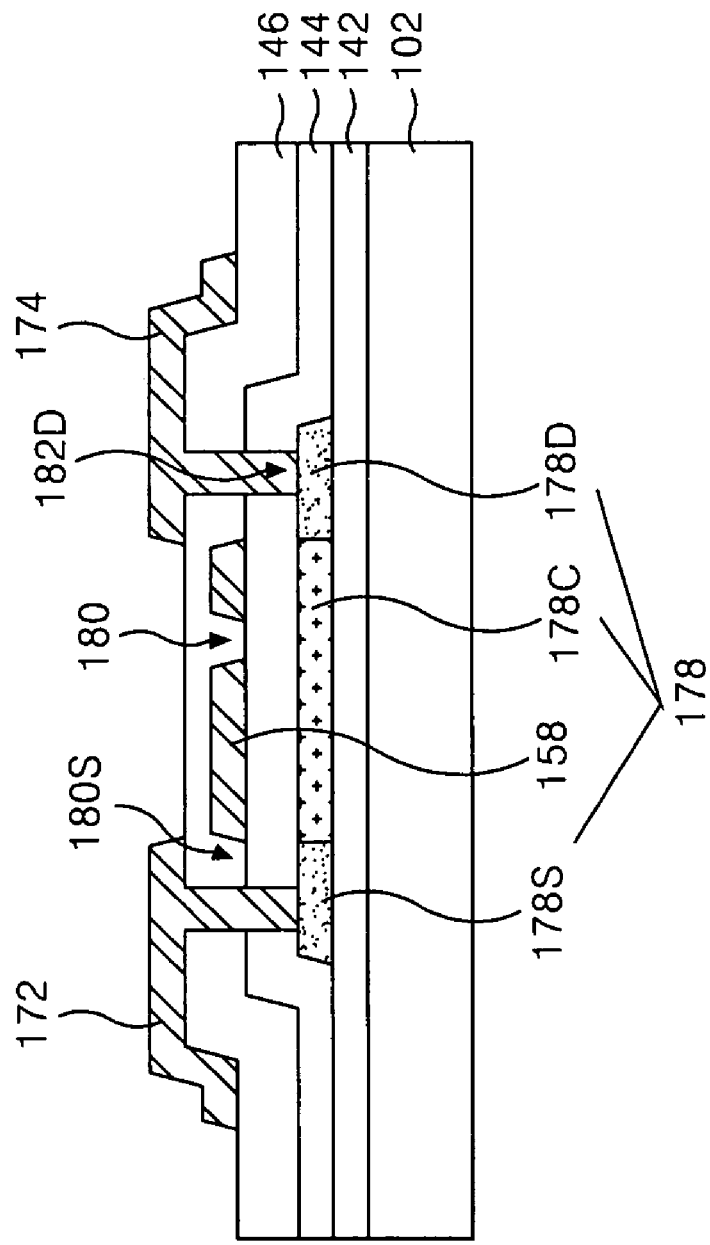
FIG. 8 is a sectional view of the thin film transistor along I-I' shown in FIG. 7.

FIG. 7 is a planar view showing a thin film transistor according to an embodiment of the present invention, and FIG. 8 is a sectional view of the thin film transistor along I-I' shown in FIG. 7. As shown in FIGS. 7 and 8, a TFT includes a buffer layer 142 on a substrate 102, a ploy-Si semiconductor pattern 178 on the buffer layer 142, a gate insulating film 144 on the ploy-Si semiconductor pattern 178, a gate electrode 158 on the gate insulating film 144 and having a hole 180 partially overlapped with the ploy-Si semiconductor pattern 178 and passing through the gate electrode 158, an interlayer insulating film 146 covering the gate electrode 158, a source electrode 172 contacted with the ploy-Si semiconductor pattern 178, and the drain electrode 174.

The TFT may be a n-type TFT doped with impurities, and the impurities may have five valence electrons and include one of antimony (Sb), arsenic (As) and phosphorus (P). The buffer layer 142 may be formed on an entire surface of the substrate 102, and the gate electrode 158 overlaps a channel area 178c of the ploy-Si semiconductor pattern 178 with having the gate insulating film 144 therebetween.

In addition, the hole 180 in the gate electrode 158 may be formed in a rectangular-like shape in a planar view and may be parallel to a long-direction of the gate electrode 158 and crossing the ploy-Si semiconductor pattern 178 with having the gate insulating film 144 therebetween. Accordingly, the gate electrode 158 has a structure in which the gate electrode 158 and the poly-Si semiconductor pattern 178 overlap at two areas.

Further, the source electrode 172 is insulated from the gate electrode 158 with the interlayer insulating film 146 therebetween and contacts a source area 178S of the ploy-Si semiconductor pattern 178 via a source contact hole 180S. The source area 178S may be doped by injecting $n^+$ ions. The drain electrode 174 is insulated from the gate electrode 158 with the interlayer insulating film 146 therebetween and contacts a drain area 178D of the ploy-Si semiconductor pattern 178 via a drain contact hole 182D. The drain area 178D may be doped by injecting $n^+$ ions.

Moreover, the ploy-Si semiconductor pattern 178 has first and second channels C1 and C2 between the source electrode 172 and the drain electrode 174, and the driving TFT T2 has a structure in which a first sub-TFT ST1 having the first channel C1 and a second sub-TFT ST2 having the second channel C2 are series-connected with each other between the source electrode 172 and the drain electrode 174.

Furthermore, the ploy-Si semiconductor pattern 178 has a varying width without an abrupt or step-like change in width.

The poly-Si semiconductor pattern 178 may have a tapering width where it overlaps the gate electrode 158, such that its width gradually narrows or becomes progressively smaller toward one of the source electrode 172 and the drain electrode 174 along at least a portion of a short-direction of the gate electrode 158. For example, when the TFT is of an n-type, the width of the semiconductor pattern 178 may gradually narrows from the drain electrode 174 to the source electrode 172 in channel regions. Thus, a region where the gate electrode 158 and the semiconductor pattern 178 overlapping each other has a trapezoid-like shape from a planar view. Accordingly, the driving TFT has a dual-gate structure that does not have a cusp region in its channel regions that could result an unintentional electric field concentration that could deteriorate the TFT. In addition, the TFT reduces the kink effect problem in the related art driving TFT even in high-level resolution models.

Figure 4:
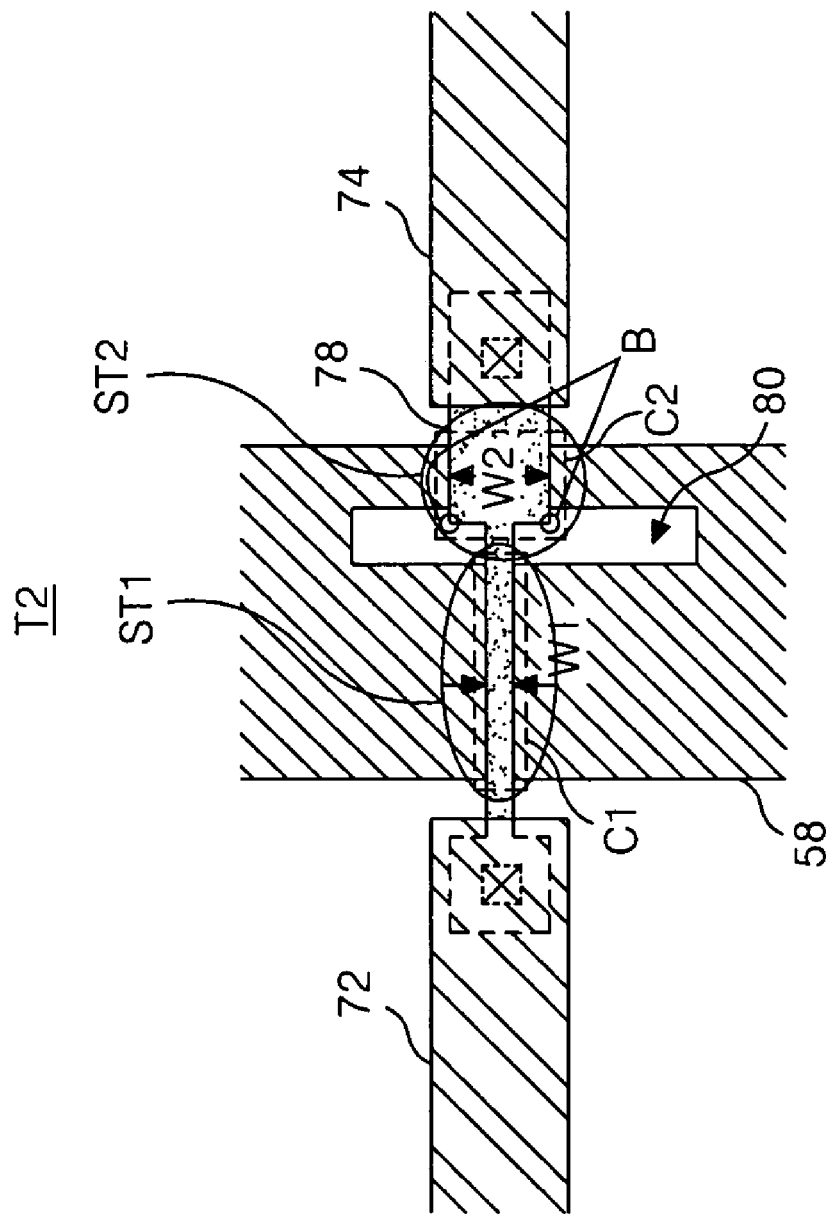
FIG. 4 is a planar schematic diagram illustrating another driving thin film transistor employing poly-Si semiconductor having a dual-gate structure according to the related art.
Figure 9:
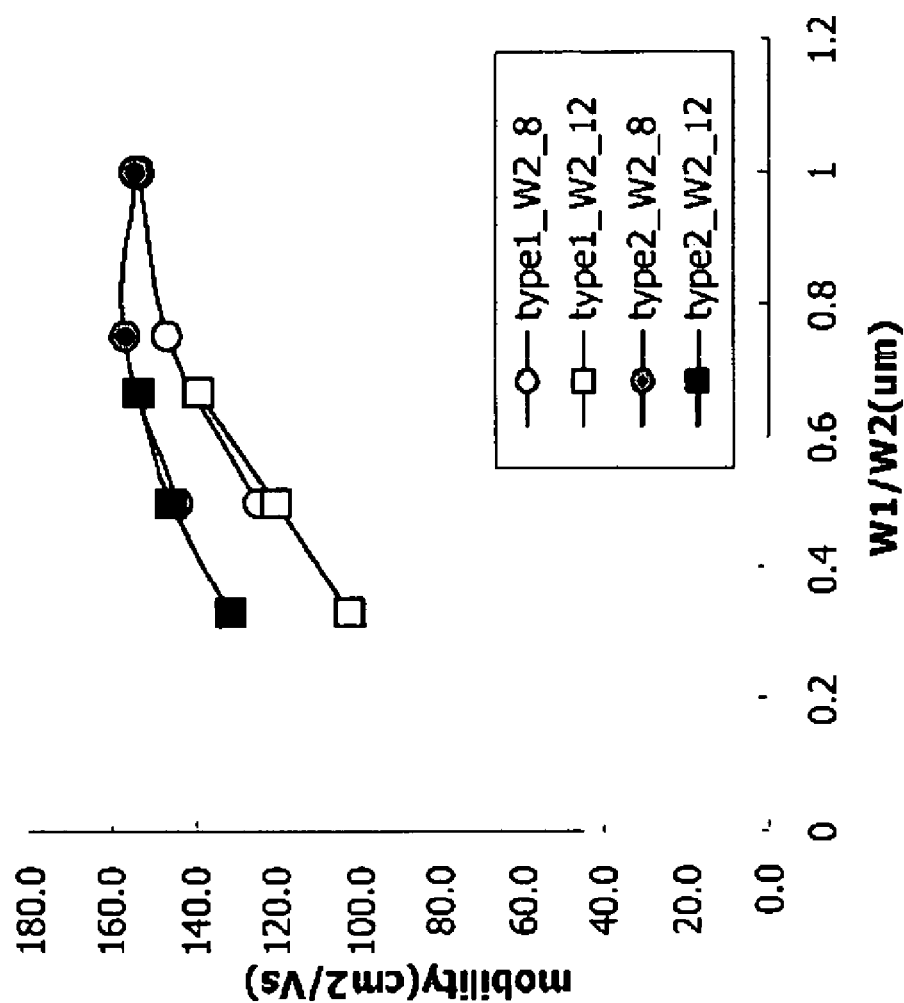
FIG. 9 is a diagram illustrating experiment data comparing current mobility of a thin film transistor having the dual-gate structure shown in FIGS. 7 and 8 with current mobility of a thin film transistor having the dual-gate structure shown in FIG. 4.

FIG. 9 is a diagram illustrating experiment data comparing current mobility of a thin film transistor having the dual-gate structure shown in FIGS. 7 and 8 with current mobility of a thin film transistor having the dual-gate structure shown in FIG. 4. A type 2 in FIG. 9 is a flowing chart of a current flowing the channel of the driving TFT according to an embodiment of the invention as shown in FIG. 7, and a type 1 in FIG. 9 is a flowing chart of a current flowing the channel of the driving TFT according to the related art as shown in FIG. 4. A square in the type 1 and type 2 curves shows a magnitude of mobility in case that a value of a second channel width W2 is approximately 8 µm, and a circle in the type 1 and type 2 curves shows a magnitude of mobility in case that a value of a second channel width W2 is approximately 12 µm.

Referring to the result shown in FIG. 9, if a value (W1/W2) in which the first channel width is divided by the second channel width is 1, that is, if the first channel width W1 and the second channel width W2 are the same as each other, then the mobility in a driving TFT according to the related art and mobility in a driving TFT according to an embodiment of the invention are the same. In addition, if the first channel width W1 and the second channel width W2 are different from one another, then current mobility of a driving TFT according to an embodiment of the invention is faster than the mobility in a driving TFT according to the related art. Accordingly, if ploy-Si semiconductor pattern is formed to have narrow a width as it goes from the drain electrode 174 to the source electrode 172, then mobility is improved. In addition, a tapering width in the ploy-Si semiconductor pattern according to an embodiment of the invention improves current mobility of the thin film transistor.

FIGS. 10A and 10B are diagrams illustrating an output current of a driving thin film transistor having the dual-gate structure shown in FIG. 4 and an output current of a driving thin film transistor having the dual-gate structure shown in FIGS. 7 and 8, respectively (hereinafter, an output current refers to a current Ids that flows between the source electrode and the drain electrode of the driving TFT). Referring to FIG. 10A and FIG. 10B, a difference between the output currents Ids of the driving TFT having the dual-gate structure shown in FIG. 4 and the output currents Ids of the driving TFT having the dual-gate structure shown in FIG. 8 is not significant, and the kink effect phenomenon is not generated. Accordingly, there is no problem of driving the organic light-emitting cell by employing a driving thin film transistor having the dual-gate structure according to an embodiment of the present invention.

FIGS. 11A and 11B are diagrams illustrating an output current of a driving thin film transistor having the dual-gate structure shown in FIG. 4 and an output current of a driving thin film transistor having the dual-gate structure shown in FIGS. 7 and 8 before and after a stress in a specific condition. FIG. 11A illustrates experiment data showing the output current Ids of the driving TFT in case that the driving TFTs are driven depending upon the related art driving condition, and FIG. 11B illustrates experiment data showing the output current Ids of the driving TFT in case that the driving TFTs are normally driven after applying a strong stress.

Referring to FIGS. 11A and 11B, a curve D1 represents Ids of the driving TFT having the dual-gate structure shown in FIG. 8 when Vds is 10V, a curve D2 represents Ids of the driving TFT having the dual-gate structure shown in FIG. 4 when Vds is 10V, a curve D3 represents Ids of the driving TFT having the dual-gate structure shown in FIG. 8 when Vds is 0.1V, and a curve D4 represents Ids of the driving TFT having the dual-gate structure shown in FIG. 4 when Vds is 0.1V.

Referring to FIG. 11 A, if the driving TFTs are normally driven, then the difference in Ids between the driving TFT having the dual-gate structure shown in FIG. 8 and the driving TFT having the dual-gate structure shown in FIG. 4 is not significant. But, if the driving TFT according to an embodiment of the present invention and the driving TFT according to the related art shown in FIG. 4 are normally driven after Vgs and Vth (threshold voltage) are set as approximately 0.8V, Vds is set as approximately 20V and a strong stress is applied on the condition of approximately 100 sec, then a D3 curve in FIG. 11B has a relatively low decrement in comparison to D4. In other words, if a strong stress is applied to the driving TFT, then the driving TFT according to an embodiment of the present invention endures well against a stress in comparison to the driving TFT that has the cusp in the channel area according to the related art as shown in FIG. 4. Accordingly, the driving TFT according to an embodiment of the present invention has a structure that does not have a cusp in the channel area, thereby alleviating a deterioration of the element.

As a result, the driving TFT according to an embodiment of the present invention reduces the kink effect problem in the related art, solves the application problem of the high-level resolution model in the related art, and avoids the deterioration problem by the electric field concentration at the cusp in the related art. Thus, credibility of the driving TFT according to an embodiment of the present is improved, to thereby increase life span of the organic electro-luminescence display device and to enhance the credibility of the organic electro-luminescence display device.

Although an n-type TFT is described in the above-mentioned organic electro-luminescence display device, a p-type TFT may alternatively be formed. For example, a TFT having the above-mentioned dual-gate structure may be an p-type TFT doped with impurities, and the impurities may include one of boron (B), gallium (Ga) and indium (In). An p-type driving TFT may be driven by an opposite polarity from the n-type driving TFT, to thereby include the p-type ploy-Si semiconductor pattern formed in such a manner to narrow a width as it goes from the source electrode to the drain electrode.

Furthermore, the driving TFT according to an embodiment of the present invention may be employed in an organic electro-luminescence display device, other flat panel display devices, such as the liquid crystal display, or as a switching element.

As described above, a thin film transistor and an organic electro-luminescence display device employing the same according to an embodiment of the present invention include a driving TFT having an n-type ploy-Si semiconductor pattern formed in such a manner to narrow a width as it goes from the drain electrode to the source electrode. In addition, a thin film transistor and an organic electro-luminescence display device employing the same according to another embodiment of the present invention include a driving TFT having a p-type ploy-Si semiconductor pattern formed in such a manner to narrow a width as it goes from the source electrode to the drain electrode.

The driving TFT according to an embodiment of the present invention prevents a kink effect problem, is easily applied to a high-level resolution model, and avoids a deterioration problem by an electric field concentration. As a result, life span and credibility of a driving element for driving an organic light-emitting cell are improved, and life span and credibility of the organic electro-luminescence display device also are improved.

It will be apparent to those skilled in the art that various modifications and variations can be made in the thin film transistor and the organic electro-luminescence display device employing the same of embodiments of the invention without departing from the spirit or scope of the invention. Thus, it is intended that embodiments of the invention cover the modifications and variations of this invention provided they come within the scope of the appended claims and their equivalents.

What is claimed is:

1. A thin film transistor, comprising:
   a semiconductor pattern on a substrate;
   a gate insulating film to cover the semiconductor pattern;
   a gate electrode partially overlapping the semiconductor pattern with the gate insulating film therebetween;
   a hole in the gate electrode to expose the gate insulating film;
   an interlayer insulating film to cover the gate electrode; and
   a source electrode and a drain electrode contacting the semiconductor pattern through the interlayer insulating layer and the gate insulating layer,
   wherein the semiconductor pattern includes at least two channels between the source electrode and the drain electrode, the at least two channels having a region with a varying width, wherein the semiconductor pattern includes an n-type polycrystalline silicone, wherein the n-type semiconductor pattern has a width that narrows as the pattern extending from the drain electrode to the source electrode.

2. The thin film transistor as claimed in claim 1, wherein the hole is a rectangular type parallel to the gate electrode.

3. The thin film transistor as claimed in claim 1, wherein the semiconductor pattern has a width smaller than a length of the hole and overlaps the gate electrode in at least two areas.

4. An organic electro-luminescence display device, comprising:
   an organic electro-luminescence array portion on a substrate and having organic light- emitting cells arranged in a matrix type; and
   a thin film transistor array portion between the substrate and the organic electro-luminescence array portion, and including a thin film transistor for driving the organic light-emitting cells, wherein the thin film transistor includes:
   a gate insulating film to cover a semiconductor pattern;
   a gate electrode partially overlapping the semiconductor pattern with the gate insulating film therebetween;
   a hole in the gate electrode to expose the gate insulating film;
   an interlayer insulating film to cover the gate electrode; and
   a source electrode and a drain electrode contacting the semiconductor pattern through the interlayer insulating layer and the gate insulating layer,
   wherein the semiconductor pattern includes at least two channels between the source electrode and the drain electrode, the at least two channels having a region with a varying width, wherein the semiconductor pattern includes an n-type polycrystalline silicone, wherein the n-type semiconductor pattern has a width that narrows as the pattern extending from the drain electrode to the source electrode.

5. The organic electro-luminescence display device as claimed in claim 4, wherein the hole is a rectangular type parallel to the gate electrode.

6. The organic electro-luminescence display device as claimed in claim 4, wherein the semiconductor pattern has a width smaller than a length of the hole and overlaps the gate electrode in at least two areas.

* * * * *